United States Patent [19]

Ermanis et al.

[11] 3,929,589

[45] Dec. 30, 1975

[54] SELECTIVE AREA OXIDATION OF III-V COMPOUND SEMICONDUCTORS

[75] Inventors: Felix Ermanis, Summit; Bertram Schwartz, Westfield, both of N.J.

[73] Assignee: Bell Telephone Laboratories, Incorporated, Murray Hill, N.J.

[22] Filed: Feb. 8, 1974

[21] Appl. No.: 440,657

[52] U.S. Cl. .................... 204/15; 204/56 R

[51] Int. Cl.² .................... C23B 11/02; C25D 5/02

[58] Field of Search .................... 204/15, 56 R

[56] References Cited

UNITED STATES PATENTS

| | | | |
|---|---|---|---|
| 3,432,405 | 3/1969 | Pilling et al. | 204/15 |
| 3,506,887 | 4/1970 | Gutteridge | 204/15 |
| 3,723,258 | 3/1973 | Podell et al. | 204/15 |
| 3,798,139 | 3/1974 | Schwartz | 204/56 R |
| 3,844,904 | 10/1974 | Yahalom | 204/56 R |

FOREIGN PATENTS OR APPLICATIONS

| | | | |
|---|---|---|---|
| 1,041,314 | 9/1966 | United Kingdom | 204/15 |

*Primary Examiner*—T. M. Tufariello
*Attorney, Agent, or Firm*—L. H. Birnbaum

[57] ABSTRACT

A method for selectively oxidizing the surface of a III-V compound semiconductor wafer. A photoresist mask is first formed on the surface of the semiconductor leaving exposed the areas to be oxidized. The semiconductor is then made the anode in an electrolytic cell wherein the electrolyte comprises water and a source of ions for adjusting the pH or providing conductivity to the solution. In a preferred embodiment, the wafer is a gallium containing compound semiconductor and in particular GaAs, and the electrolyte is water and an ammonium acid phosphate. The oxide is grown electrolytically only into the exposed areas of the wafer, and the photoresist may then be stripped off leaving the desired oxide pattern.

19 Claims, 6 Drawing Figures

SELECTIVE AREA OXIDATION OF III-V COMPOUND SEMICONDUCTORS

BACKGROUND OF THE INVENTION

This invention relates to a method for oxidizing selected areas of a III-V compound semiconductor material.

In the fabrication of a wide variety of semiconductor devices, it is desirable to provide a specified oxide pattern on the surface of the semiconductor. This pattern may be utilized, for example, to define an electrical contact pattern in the final device or during processing as a mask in diffusion and etching operations. The generally accepted procedure for forming such an oxide pattern is to grow or deposit an oxide over the entire surface of the semiconductor, deposit a photoresist on the oxide, develop the photoresist, and then etch the oxide in the areas exposed by the developed photoresist. This procedure is adequate for most applications. In the processing of III-V compounds, however, undercutting of the oxide can result during the development of the photoresist or during the etching out of the exposed oxide. This problem is especially troublesome where fine line patterns must be defined as in the fabrication of field effect transistors, which require line widths in the micron range.

It is therefore desirable to eliminate the necessity of etching a native oxide to form a desired pattern by providing some means for electrolytically growing an oxide on selected portions of a III-V semiconductor. While electrolytic oxidation of the entire surface of a gallium compound semiconductor has been described (see U.S. Pat. application of B. Schwartz, Ser. No. 292,127, filed Sept. 25, 1972, now U.S. Pat. No. 3,798,139 ) and various proposals for selective thermal oxidation are known (see e.g., U.S. Pat. No. 3,602,984), it does not appear that a viable method for the selective electrolytic oxidation of III-V compounds has been previously taught.

SUMMARY OF THE INVENTION

In accordance with the invention, a method is described for electrolytically oxidizing selected portions of a III-V compound semiconductor material. A photoresist layer is deposited on the surface of the material and developed so as to expose the portions of the semiconductor to be oxidized. A native oxide is then grown only in the exposed areas by immersing the semiconductor in an electrolyte consisting of water and a source of ions for adjusting the pH or adding conductivity to the solution, and applying an appropriate bias. The photoresist may then be stripped off leaving the desired oxide pattern on the surface of the semiconductor. In a preferred embodiment, the semiconductor comprises a gallium compound, particularly gallium arsenide, and the electrolyte is water and an ammonium acid phosphate.

BRIEF DESCRIPTION OF THE DRAWING

These and other features of the invention are delineated in detail in the description to follow. In the drawing.

DETAILED DESCRIPTION OF THE INVENTION

The principles of the invention can best be understood by the following description of one embodiment in association with FIGS. 1A-1D, which illustrate a semiconductor wafer in various stages of manufacture. The semiconductor used was an n-type wafer of GaAs, illustrated as 10 in FIG. 1A, which was Te-doped to a concentration of approximately $10^{18}$ $cm^{-3}$. Deposited on the top surface of the wafer by standard techniques is a layer of photoresist material 11. The particular photoresist used was a mixture of an alkali-soluble cresol formaldehyde resin and a naphthoquinone diazide sold under the trade name AZ-111. This particular photoresist material is not essential to the invention and any other photoresist could be used which possesses a high dielectric strength. Thus, any photoresist whose breakdown voltage is at least $10^4$ volts/cm should provide good masking in the subsequent electrolytic oxidation. Examples of some other useful materials are: AZ-340 and AZ-1350 which have basically the same composition as AZ-111; and KTFR which is a cyclized polyisoprene with 2, 6 bis (p-azidobenzal) — 4 methyl — cyclohexanone as a cross linking agent.

Figure 1A:
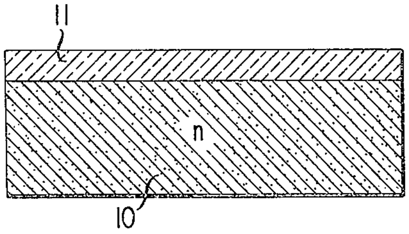
FIGS. 1A – 1D are cross-sectional views of a semiconductor wafer during various stages of manufacture in accordance with one embodiment of the invention.
Figure 1B:
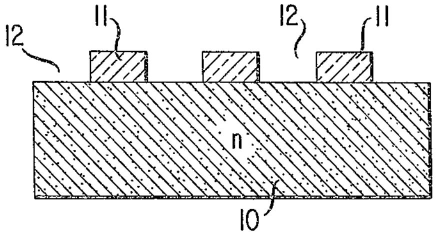
Figure 2:
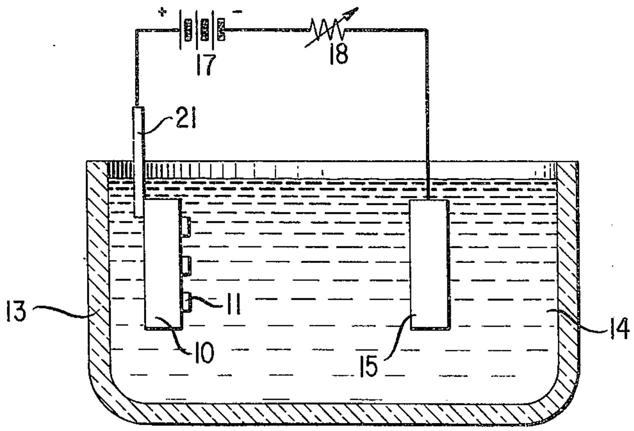
FIG. 2 is a schematic illustration of an electrolytic oxidation system for use in accordance with the same embodiment.

The photoresist is then exposed to light through a suitable mask and developed in accordance with standard photolithographic techniques to expose areas 12 of the semiconductor while the remainder of the surface is protected by the photoresist as shown in FIG. 1B. The particular developer used was primarily an aqueous solution of NaOH. The structure is then oxidized in an electrolytic system, one embodiment of which is illustrated in FIG. 2. The liquid electrolyte 14 is confined within an ordinary container 13. The structure of FIG. 1B is attached to an oxidizable metal 21 and immersed in the electrolyte along with an electrode 15 comprising one of the noble metals such as platinum or gold. Electrically coupled to these samples are a d.c. current source 17 and a variable resistor 18 which together represent a constant voltage source. The semiconductor 10 is made the anode and the noble metal 15 is made the cathode of the system. Although a constant voltage source is described in this system, it will be appreciated that a constant current source could be substituted therefor.

Figure 1C:
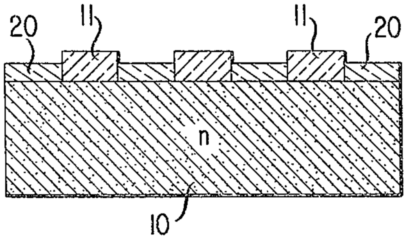

In accordance with one feature of the invention, the electrolyte consists of water and a source of ions which provide conductivity to the water or adjust the pH. In a preferred embodiment, the source of ions consists of an ammonium acid phosphate, that is, a material with the composition $(NH_4)_{3-x}H_xPO_4$ where $x = 0 - 2$. This material keeps the pH of the solution at 5 – 9 while providing ions for adding conductivity to the solution (specifically, $[NH_4]^+$, $[H_2PO_4]^-$, $[HPO_4]^{-2}$ and $[PO_4]^{-3}$). In this particular embodiment, a 0.1 Normal aqueous solution of dibasic ammonium acid phosphate ($(NH_4)_2HPO_4$) was utilized to form the electrolyte. A useful range of concentrations for ammonium acid phosphates appears to be 0.001 – 1.0 Normal. Other possible electrolytes are discussed later. A potential of approximately 55 volts was applied to the sample, although a range of approximately 5 – 175 volts would be useful. As illustrated in FIG. 1C, a native oxide, 20, was grown in the exposed areas of the semiconductor while the photoresist successfully masked the remainder of the surface. The oxide was approximately 1000 A thick after approximately 60 seconds. Of course, the thickness of the oxide may be adjusted by varying the applied potential or the time of oxidation or by heating the electrolyte. The adjustment of such parameters needed to achieve a particular oxide thickness in order to fit a particular function in the device can be easily determined by those skilled in the art.

Figure 1D:
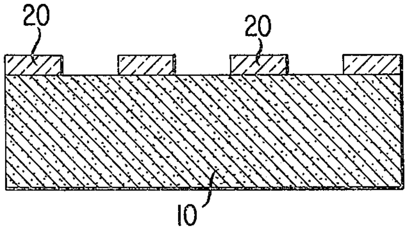

The photoresist is then stripped off with acetone or any other material which dissolves the photoresist and not the oxide in order to leave the desired oxide pattern as shown in FIG. 1D. If a drying cycle is desired, a useful range of temperature and time appears to be 150°–350° C for one-half hour to 48 hours in a non-oxidizing ambient such as nitrogen. The structure of FIG. 1D may then be processed according to a particular need. For example, the oxide could act as a mask in diffusion, etching or electrode application operations on the exposed areas. Further, the oxide could be used as the gate insulator in a field effect transistor. It should also be clear that the invention could be used in fabrication of single devices or in the batch processing of several devices on a wafer.

The oxide grown by this method is a native amorphous oxide comprising gallium oxide. The reaction apparently proceeds as follows:

$$GaAs + H_2O \rightarrow Ga_2O_3 \cdot H_2O + As_2O_3 \cdot H_2O \qquad (1)$$

It is believed that the properties of the oxide are due to the mixture of the product of the group III and group V elements (in this case $Ga_2O_3$ and $As_2O_3$ respectively). Thus, it is expected that the same or similar oxides will be grown not only on semiconductors containing appreciable amounts of gallium (at least 5%), but on all III-V compounds including ternary and quadernary compounds. Other useful materials therefore include GaP, AlGaAs, AlGaP, InGaP, InGaAs, GaAsP, InSb, InAs, and mixtures thereof.

Although the invention has been described in terms of an electrolyte comprising water and an ammonium acid phosphate, it should be clear that other electrolytes could be used. It has been found, for example, that a native amorphous oxide is grown selectively on the surface of a gallium compound semiconductor in accordance with the invention with an electrolyte of water which has been adjusted to a pH of 1-5 or 9—13 by a source of $[H]^+$ or $[OH]^-$ ions. In one experiment, an n-type GaAs wafer masked with the same photoresist as in the above embodiment was immersed in an electrolyte of $H_2O$ which was adjusted to a pH or approximately 2.5 by the addition of $H_3PO_4$. When a potential of approximately 55 volts was supplied, the oxide was again grown to a thickness of about 1000 A after 60 seconds only in the exposed areas. It was further determined after stripping the photoresist that oxide stripes 5 microns wide were well delineated on the surface. A similar experiment was performed in an electrolyte of water adjusted to a pH of approximately 10 by $NH_4OH$. A constant potential of 120 V for about 20 seconds produced an oxide in the exposed areas of the semiconductor which was approximately 1000 A thick. In the case of basic water, however, it was found that the sample should not be immersed in solution for periods exceeding approximately a few minutes since the photoresist will begin to deteriorate. It was also found that in the case of acidic water the photoresist began to deteriorate after a few minutes exposure to the solution, whereas in water with ammonium acid phosphate as the conductivity modifier, negligible attack on the photoresist was observed even after 10 minutes. It can be seen, therefore, that water with an ammonium acid phosphate added is preferred. However, acidic or basic water may be utilized for short periods of time and still produce a useful oxide pattern. It should also be realized that other materials may be used in the electrolyte for providing conductivity to the solution. For example, the tartrates, citrates and oxalates would provide ions of $[C_4O_6H_5]^-$, $[C_6O_7H_7]^-$ and $[C_2O_4H]^-$ respectively which would not attack the oxide or photoresist while providing conductivity.

In general, therefore, it may be stated that the electrolyte which may be utilized for selective electrochemical oxidation in accordance with the invention is water with a material for supplying one or more of the ions $[H]^+$, $[OH]^-$, $[NH_4]^+$, $[PO_4]^{-3}$, $[HPO_4]^{-2}$, $[H_2PO_4]^-$, $[C_4O_6H_5]^-$, $[C_6O_7H_7]^-$ or $[C_2O_4H]^-$.

Other important modifications should be clear. For example, although oxidations above were performed at room temperature, the electrolyte may be heated up to its boiling point to increase the rate of oxidation. A pulsed d.c. potential may also be employed in the system to prevent breakdown of the oxide at higher applied bias (i.e., greater than 200 volts). It will also be realized that the system is self-limiting since the growing oxide will cause increasing resistance at the surface of the wafer.

Figure 3:
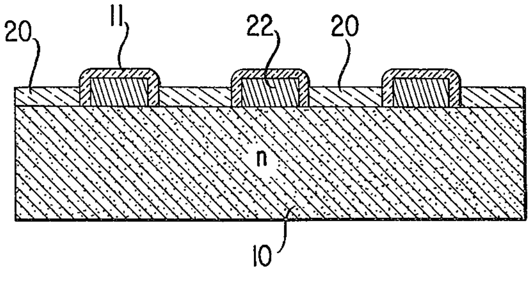
FIG. 3 is a cross-sectional view of a semiconductor wafer during one stage of manufacture in accordance with a further embodiment.

Finally, it should be recognized that a further advantage accrues from the present method. That is, it is now possible to oxidize a semiconductor wafer with non-oxidizable contacts already on the surface. This is illustrated in FIG. 3 which is a cross-sectional view of a semiconductor wafer after oxidation in accordance with the invention, with similar elements bearing the same numbers as FIGS. 2A – 2D. It will be seen that oxidation is accomplished by forming the photoresist mask 11 over an area of the semiconductor including the contacts 22. During oxidation, shorts are prevented by the presence of the photoresist over the contacts and the oxide 20 grows in the exposed areas as before.

Various additional modifications will become apparent to those skilled in the art. All such variations which basically rely on the teachings through which the invention has advanced the art are properly considered within the spirit and scope of the invention.

What is claimed is:

1. A method for forming an oxide on selected portions of the surface of a gallium containing compound semiconductor comprising the steps of:

forming a mask of a photoresist material over the surface of said semiconductor so as to leave exposed selected portions of the surface to be oxidized;

making the semiconductor the anode in an electrolytic cell wherein the electrolyte comprises $H_2O$ and a material of the composition $(NH_4)_{3-x} H_x PO_4$ where $x = 0 - 2$, and passing a current through said cell so as to grow an oxide into the exposed portions of the semiconductor surface; and removing the photoresist mask from the surface of the semiconductor so as to leave the oxide on the selected portions of the surface.

2. The method according to claim 1 wherein the semiconductor is selected from the group consisting of GaP, GaAs, AlGaAs, AlGaP, InGaP, and InGaAs.

3. The method according to claim 1 wherein the pH of the electrolyte is within the range 5 – 9.

4. The method according to claim 1 wherein areas of conductive material are included on the surface of said semiconductor and said photoresist mask is formed over said surface including said areas of conductive material.

5. The method according to claim 1 wherein a constant potential is applied to said cell.

6. The method according to claim 1 wherein a constant current is applied to said cell.

7. The method according to claim 1 wherein the applied potential is a pulsed d.c. potential.

8. The method according to claim 1 wherein the temperature of the electrolyte is at the boiling point of said solution.

9. The method according to claim 1 wherein the applied potential lies within the range of 5 – 175 volts.

10. The method according to claim 1 wherein the breakdown voltage of the photoresist is at least $10^4$ volts/cm.

11. A method for forming an oxide on selected portions of the surface of a GaAs semiconductor comprising the steps of:

forming a mask of a photoresist material over the surface of said semiconductor so as to leave exposed selected portions of the surface to be oxidized;

making the semiconductor the anode in an electrolytic cell wherein the electrolyte comprises $H_2O$ and a material of the composition $(NH_4)_{3-x} H_x PO_4$ where $x = 0 - 2$, and passing a current through said cell so as to grow an oxide into the exposed portions of the semiconductor surface; and removing the photoresist mask from the surface of the semiconductor so as to leave the oxide on the selected portions of the surface.

12. The method according to claim 11 wherein the pH of the electrolyte is within the range 5 – 9.

13. The method according to claim 11 wherein areas of conductive material are included on the surface of said semiconductor and said photoresist mask is formed over said surface including said areas of conductive material.

14. The method according to claim 11 wherein a constant potential is applied to said cell.

15. The method according to claim 11 wherein a constant current is applied to said cell.

16. The method according to claim 11 wherein the applied potential is a pulsed d.c. potential.

17. The method according to claim 11 wherein the temperature of the electrolyte is at the boiling point of said solution.

18. The method according to claim 11 wherein the applied potential lies within the range of 5 – 175 volts.

19. The method according to claim 11 wherein the breakdown voltage of the photoresist is at least $10^4$ volts/cm.

* * * * *